(12) United States Patent
Mohamed Ragab et al.

(10) Patent No.: US 12,212,329 B2
(45) Date of Patent: Jan. 28, 2025

(54) INCREMENTAL DELTA MODULATION FOR ANALOG TO DIGITAL CONVERTER SIGNAL TO NOISE RATIO AND LINEARITY ENHANCEMENT

(71) Applicant: Avago Technologies International Sales Pte. Limited, Singapore (SG)

(72) Inventors: Kareem Abdelghani Ibraheem Mohamed Ragab, Irvine, CA (US); Xiaofeng Lin, Irvine, CA (US); Darwin Cheung, Irvine, CA (US); Chi Mo, Irvine, CA (US); Vinay Chandrasekhar, Irvine, CA (US); Jungwoo Song, Irvine, CA (US); Xicheng Jiang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 174 days.

(21) Appl. No.: 18/117,354

(22) Filed: Mar. 3, 2023

(65) Prior Publication Data
US 2024/0297657 A1    Sep. 5, 2024

(51) Int. Cl.
| H03M 1/06 | (2006.01) |
| H03M 1/08 | (2006.01) |
| H03M 1/46 | (2006.01) |
| H03M 1/68 | (2006.01) |
| H03M 1/80 | (2006.01) |
| H03M 3/00 | (2006.01) |

(52) U.S. Cl.
CPC ......... *H03M 1/0604* (2013.01); *H03M 1/066* (2013.01); *H03M 1/0673* (2013.01); *H03M 1/0678* (2013.01); *H03M 1/0854* (2013.01); *H03M 1/468* (2013.01); *H03M 1/687* (2013.01); *H03M 1/804* (2013.01); *H03M 3/338* (2013.01); *H03M 3/35* (2013.01); *H03M 3/39* (2013.01)

(58) Field of Classification Search
CPC .. H03M 1/0604; H03M 1/066; H03M 1/0673; H03M 1/0678; H03M 1/0854; H03M 1/687; H03M 1/804; H03M 3/338; H03M 3/35; H03M 3/39; H03M 1/468
USPC .......................................... 341/118, 161, 172
See application file for complete search history.

(56) References Cited

U.S. PATENT DOCUMENTS

| 8,766,839 B2 * | 7/2014 | Janakiraman ....... H03M 1/0697 341/161 |
| 2010/0097256 A1 | 4/2010 | Hurrell et al. |
| 2023/0116785 A1 * | 4/2023 | Yang ..................... H03M 1/468 341/143 |

OTHER PUBLICATIONS

European Search Report on non-Foley case related to US dtd Aug. 12, 2024.

* cited by examiner

*Primary Examiner* — Khai M Nguyen
(74) *Attorney, Agent, or Firm* — Foley & Lardner LLP

(57) ABSTRACT

A device (e.g., SAR ADC device) include a DAC circuit and generates a digital output based on logic circuitry that includes SAR logic. Additional logic circuitry includes delta modulation circuitry and dynamic element matching circuitry. The delta modulation circuitry provides several digital outputs of the SAR DAC, while the dynamic element matching circuitry selects a different set of capacitors from the DAC circuit. Each cycle is added together and averaged, and then added to the digital output from the SAR logic.

20 Claims, 5 Drawing Sheets

INCREMENTAL DELTA MODULATION FOR ANALOG TO DIGITAL CONVERTER SIGNAL TO NOISE RATIO AND LINEARITY ENHANCEMENT

TECHNICAL FIELD

This application is directed to analog to digital converters (ADCs), and more particularly, to modified ADCs using delta modulation (DM) and dynamic element matching (DEM) to reduce error sources.

BACKGROUND

A successive approximation register analog to digital converter (SAR ADC) converts an analog signal (e.g., continuous analog waveform) into a digital representation. A SAR ADC includes a digital to analog converter (DAC) (e.g., capacitive DAC, or CDAC) that is binary weighted, with the capacitance of each capacitor increases from a capacitor corresponding to the least significant bit (LSB) to a capacitor corresponding to the most significant bit (MSB). Additionally, a SAR ADC includes a comparator and SAR logic. During a conversion phase, the comparator that compares the output (e.g., output voltage) from the CDAC with an additional voltage for each capacitor, beginning with the capacitor corresponding to the MSB. The SAR logic determines the digital output (e.g., binary 0 for 1) based on the comparator results for each capacitor in a CDAC. For an N-bit CDAC, the digital output includes N binary digits.

Several errors sources may be present. For example, noise (e.g., noise voltage) can be introduced during the conversion phase in the SAR ADC, which may affect the accuracy of the digital output. Additionally, manufacturing issues (e.g., capacitor mismatch) can also lead to issues. As a result, the linearity of the digital output representing an analog input may be degraded.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
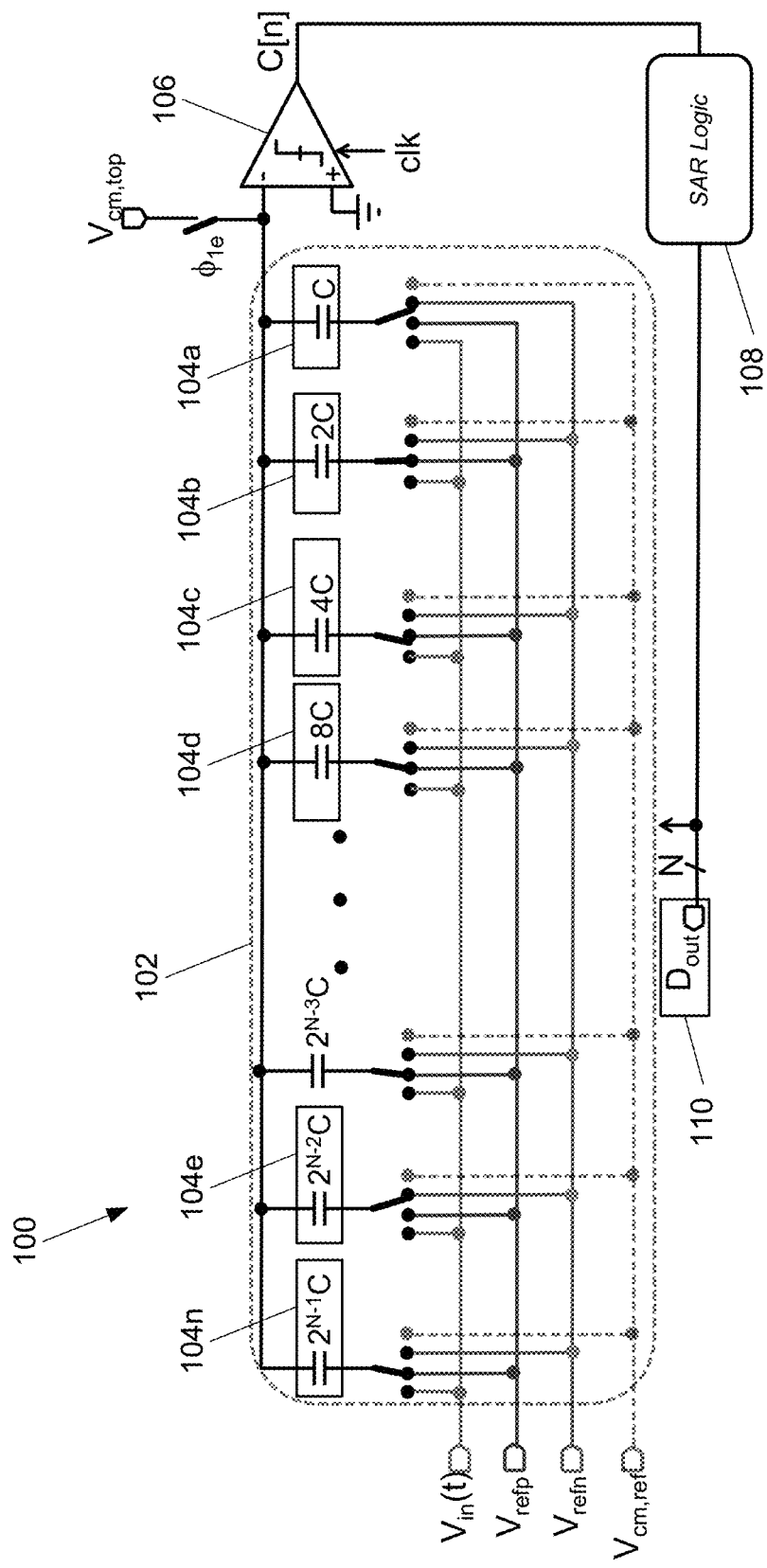
FIG. 1 illustrates a circuit diagram of an apparatus, according to one approach.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject technology is directed to modifications to a SAR ADC to reduce errors and enhance linearity. The SAR ADC may include a CDAC. Some CDACs use binary weighted capacitors, in which the capacitance (e.g., ability to store electrical charge) of successive capacitors successively increases by a factor of 2. In the embodiments described herein, a CDAC includes capacitors grouped into multiple sets (i.e., segmented capacitor sets), and each capacitor set includes capacitors with the same capacitance.

During an analog to digital conversion operation, the SAR ADC uses the CDAC, a comparator, and SAR logic to generate the digital output. The digital output may be obtained using a binary search. Additionally, however, the SAR ADC operation is followed by an incremental delta modulation (IDM) operation in which the comparator provides an output for a predetermined number (e.g., M) of cycles, resulting in codes (e.g., M codes) for each cycle. The IDM operation uses the same segmented capacitor sets of the CDAC to generate M outputs (e.g., an output for each of the M cycles). Moreover, a dynamic element matching (DEM) operation simultaneously occurs with the IDM. The DEM operation shuffles the capacitors (e.g., selects a different set of capacitors) for each cycle. Once the M cycles are complete, the M outputs are averaged and added to the digital output from the binary search.

The IDM and DEM operations may provide several benefits. For example, due to manufacturing variances, capacitors are known to include capacitor mismatch such that the respective actual and stated capacitances are not equal, thus introducing distortion (e.g., unwanted voltage) resulting in digital output error. However, by performing several cycles (using IDM), selecting different sets of capacitors (using DEM), and averaging the cycles, the voltage error is compensated. The terms "compensate," "compensated," or "compensating" may refer to offsetting a value (e.g., error voltage) by cancelling the value or at least reducing the value. The IDM and DEM operations can also reduce or eliminate additional noise, such as conversion phase noise, and noise at the comparator input. Additionally, by increasing the number of M cycles, the noise may be suppressed, thus increasing the signal-to-noise ratio (SNR) and enhancing resolution of the digital output.

These and other embodiments are discussed below with reference to FIGS. 1-5. However, those skilled in the art will readily appreciate that the detailed description given herein with respect to these Figures is for explanatory purposes only and should not be construed as limiting.

According to some embodiments, for example as shown in FIG. 1 illustrates a diagram of an apparatus 100, according to one approach. In some embodiments, the apparatus 100 is an ADC circuit, which may include a SAR ADC circuit, designed to convert an analog signal to a digital output. In this regard, the apparatus 100 may include a DAC circuit 102 (e.g., CDAC circuit) that includes several capacitors. For example, the DAC circuit 102 includes a capacitor 104a, a capacitor 104b, a capacitor 104c, a capacitor 104d, a capacitor 104e, and a capacitor 104n. As shown, the DAC circuit 102 includes n capacitors. Further, the capacitor 104a includes a capacitive value equal to C, indicating the value of the capacitor 104a can be expressed as C Farads. In some embodiments, the n capacitors are binary-weighted capacitors. For example, the capacitance values for the capacitors increases by a factor of 2 such that the capacitor 104b is 2C (or twice the capacitance value of the capacitor 104a). Similar relationships are shown for the capacitors 104c and 104d. The capacitor 104n (the nth capacitor) includes a capacitance value of $2^{N-1}$ C, representing a capacitor with the greatest capacitive value. Also, the capacitors of the DAC circuit 102 represent, or correspond to, various bits of a binary output. For example, the capacitor 104n represents the MSB of the binary output, the capacitor 104e represents the next MSB (or MSB-1), and so on. The capacitor 104a represents the LSB. As shown, the capacitors 104a through 104n can receive a voltage (e.g., $V_{in}(t)$).

The apparatus 100 further includes a comparator 106 designed to compare an output voltage, at one input, from the one or more of the capacitors 104a through 104n and compare the output voltage with a voltage (e.g., reference voltage) at an another input. The comparator 106 can receive a clock input used to determine when to generate comparisons. The apparatus 100 further includes logic circuitry 108 designed to determine an output 110 ($D_{out}$, digital output in binary form) based on the comparison from the comparator 106. The logic circuitry 108 may include logic circuitry and/or stored algorithms designed to determine the output.

To obtain the output 110, the apparatus 100 uses a SAR operation. First, an acquisition phase commences, and a voltage from analog signal (e.g., $V_{in}(t)$) is sampled and stored on the CDAC. Once the voltage across the n capacitors is settled, a voltage at the comparator 106 is measured. The comparator 106 compares the sampled voltage to the reference voltage (e.g., $V_{refp}$, $V_{refn}$, either of which may be electrical ground), when applied first to capacitor corresponding to the MSB (e.g., capacitor 104n), and the logic circuitry 108 generates a bit decision (e.g., binary value 0 or 1) based on the comparison from the comparator 106. When the comparator 106 indicates the sampled voltage is greater than the reference voltage weighted by the ratio of capacitor 104n to the sum of all capacitors, the SAR logic generates a bit decision 1, and the capacitor 104n remains connected to the positive reference. Conversely, when the comparator 106 indicates the sampled voltage is less than the reference voltage weighted by the ratio of the capacitor 104n to the sum of all capacitors, the logic circuitry 108 generates a bit decision 0, and the capacitor 104n connects to the negative reference. Then, the operation continues by successively performing comparisons after applying the reference voltage to each capacitor from the next MSB capacitor (e.g., MSB-1, corresponding to the capacitor 104e) to the LSB (e.g., the capacitor 104a). For n capacitors, the apparatus 100 will generate an n-bit output at the output 110.

Some error-related issues may occur with the apparatus 100. For example, the capacitors of the DAC circuit 102 may include errors due to mismatch, causing a corresponding error in the charge and output voltage of the capacitors. Further, sampling noise at the input of the comparator 106 based on sampling the analog voltage on the capacitors of the DAC circuit 102 may further lead to errors. Still further, the comparator 106 may contribute to conversion noise during the conversion phase. Also, DAC circuit 102 contributes to quantization noise while using the capacitors to convert the digital output to a discrete analog signal. Any one or more of these noises may lead to errors of the output 110.

Figure 2:
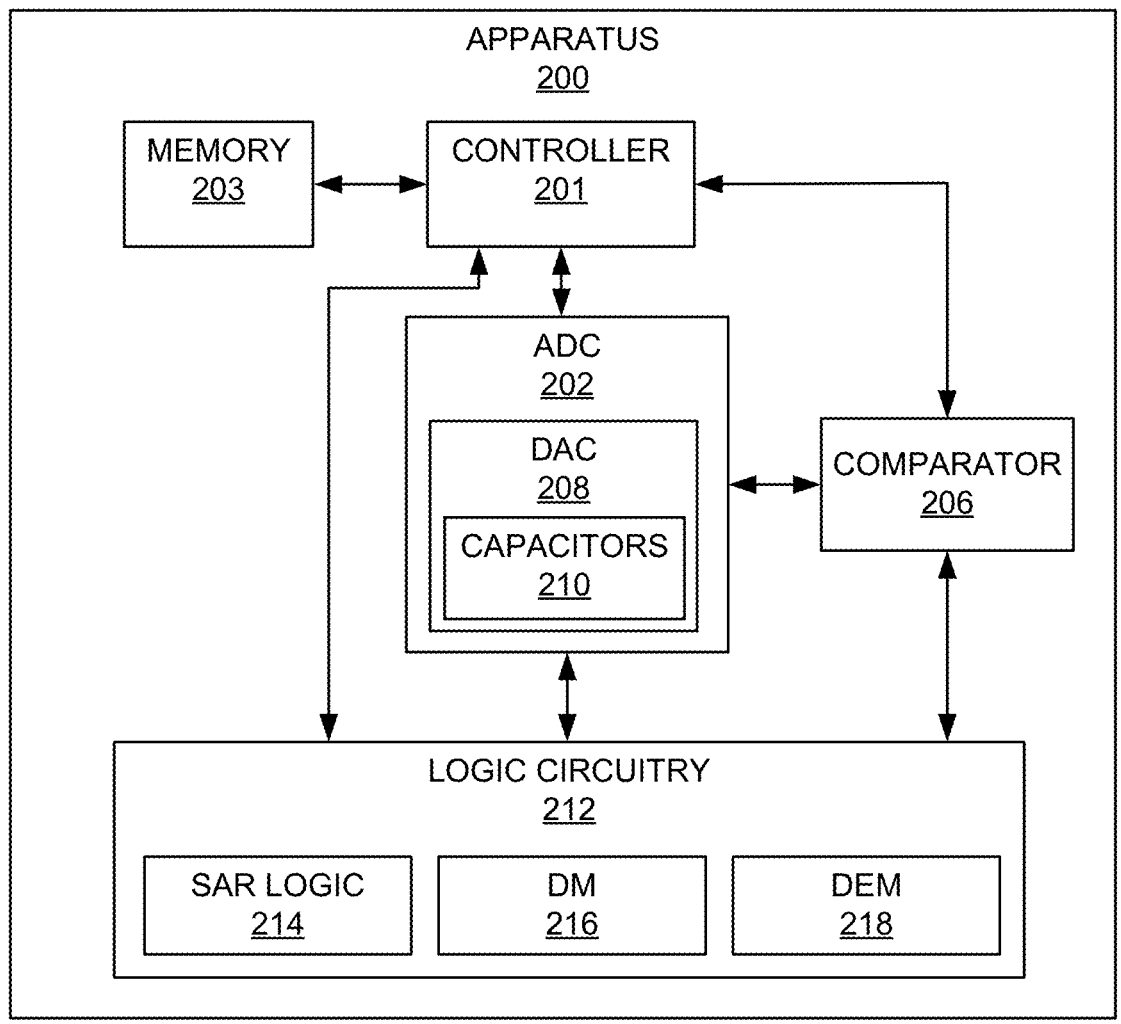
FIG. 2 illustrates a block diagram of an apparatus, in accordance with aspects of the present disclosure.

FIG. 2 illustrates a block diagram of an apparatus 200, in accordance with aspects of the present disclosure. In some embodiments, the apparatus 200 includes an ADC, such as a SAR ADC. The apparatus 200 may include a controller 201 designed to execute various functions of the apparatus 200. The controller 201 may include one or more processing circuits, microcontrollers, or a combination thereof. The apparatus 200 further includes a memory circuit 204 that stores executable instructions and/or algorithms that can be accessed by the controller 201 to carry out the functions of the apparatus 200 shown and described herein.

The apparatus 200 further includes an ADC circuit 204 coupled (e.g., electrically coupled) to the controller 201. The ADC circuit 204 designed to convert an applied analog signal to a digital output. In some embodiments, the ADC circuit 204 includes a SAR ADC that carries out a SAR operation described herein. The ADC circuit 204 may include a DAC circuit 202. In some embodiments, the DAC circuit 202 includes a CDAC circuit 208. In this regard, the DAC circuit 202 may include capacitors 210.

Also, the apparatus 200 further includes logic circuitry 212 coupled to the controller 201. The logic circuitry 212 may include SAR logic 214, which includes circuitry designed to generate a bit decision (e.g., binary value 0 or 1) based on a comparison from a comparator 206 of the apparatus 200.

The logic circuitry 212 may further include a DM circuit 216 designed to provide a DM operation, including an IDM operation. The DM circuit 216 may also provide a conversion phase of a signal sensed at the comparator with applying an analog signal. For example, after the SAR logic 214 is used to generate an output, the DM circuit 216 can convert an analog signal by using the output of the comparator to increase or decrease by a step size delta (δ) to resolve the analog signal. For example, when the comparator output is 1, the DM circuit 216 will increase the code by the step size, indicating the sampled analog signal is greater than the CDAC-generated discrete signal. Conversely, when the comparator output is 0, the DM circuit 216 will decrease the code by the step size, indicating the analog signal is less than the CDAC-generated discrete signal.

Additionally, the DM circuit 216 can perform the conversion for a predetermined (e.g., M) number of cycles. Moreover, the logic circuitry 212 further includes a DEM circuit 218 designed to shuffle, e.g., update and select one or more different capacitors from the capacitors 210 for each cycle generated by the DM circuit 216. In this regard, the DM circuit 216 and the DEM circuit 218 are designed to simultaneously provide respective operations. The shuffling operation may include a pseudo-random operation in which the selection of capacitors appears to be statistically random despite being generated by a deterministic process. The DM circuit 216 can average the output of the M cycles and add that averaged value to the output obtained by the SAR logic 214. Beneficially, by adding the averaged value to the SAR logic output, the noise in the apparatus 200 due to, for example, capacitor mismatch, quantization noise, comparator noise, conversation phase circuit noise, may be compensated.

Figure 3:
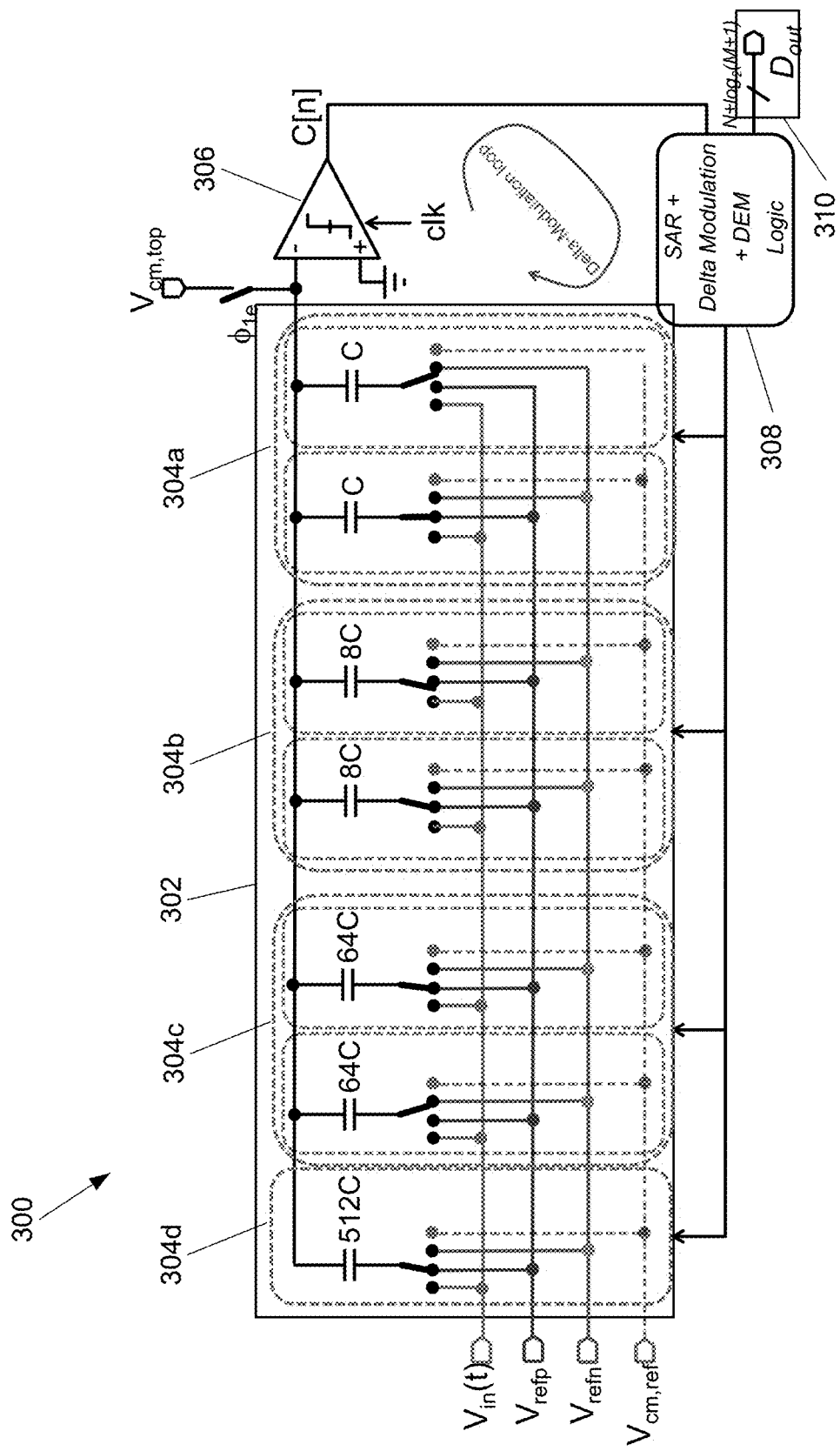
FIG. 3 illustrates a circuit diagram of an apparatus, in accordance with aspects of the present disclosure.

FIG. 3 illustrates a schematic diagram of an apparatus 300, in accordance with aspects of the present disclosure. The apparatus 300 may include any features shown and described for the apparatus 100 and the apparatus 200 (shown in FIGS. 1 and 2, respectively). In some embodiments, the apparatus 300 is an ADC circuit, which may include a SAR ADC circuit, designed to convert an analog signal to a digital output. In this regard, the apparatus 300 may include a DAC circuit 302 (e.g., CDAC circuit) that includes several capacitors. The capacitors of the DAC circuit 302 are grouped into multiple sets. For example, the capacitors are grouped into one of a set of capacitors (e.g., segmented sets of capacitors), represented by a set 304a, a set 304b, a set 304c, and a set 304d of the DAC circuit 302. Each of the sets 304a, 304b, 304c, and 304d includes a number (e.g., 15) of capacitors. Moreover, each of the capacitors in the sets 304a, 304b, 304c, and 304d may include the same capacitive value (e.g., C units), or at least approximately the same capacitive value (to within a specified range of capacitance). For example, a capacitor selected from the set 304a includes a capacitance value that is equal to, or at least approximately equal to, that of another capacitor selected from the set 304a or from the set 304b. In order to use capacitors of the same capacitive value, the capacitors in the sets 304a, 304b, 304c, and 304d may be thermometer-coded (e.g., a sequence of 0's and 1's). The capacitors in the sets 304a, 304b, 304c, and 304d can be grouped or arranged in a manner to emulate a binary weighted set of capacitors.

The apparatus 300 further includes a comparator 306 and logic circuitry 308, both of which are designed to produce an output 310 ($D_{out}$, a digital output). Similar to the logic circuitry 212 (shown in FIG. 2), the logic circuitry 308 includes circuitry for a SAR logic operation, a DM operation (including an IDM operation), and a DEM operation. Accordingly, the apparatus 300 may perform a SAR operation to generate a binary output at the output 310, and subsequently, the DM operation can perform a predetermined number of cycles while the DEM operation updates, e.g., selects, for each cycle, a different set of capacitors from the sets 304a, 304b, 304c, and 304d. The updated set of capacitors may differ by at least one capacitor, as compared to the prior set of selected capacitors. Further, the updated set of capacitors may differ by selecting capacitors that are not used in the prior set of selected capacitors, including the immediately prior art set of capacitors or any prior set of capacitors. The set of capacitors may be selected by the DEM operation based on a desired capacitive value (e.g., 8C or 4C). The SAR logic operation may be used during an applied voltage (e.g., $V_{in}(t)$), and the sets 304a, 304b, 304c, and 304d may be arranged and utilized in a binary weighted manner. For example, the set 304a may include 15 capacitors arranged as 8C (8 e.g., 8 capacitors each with a capacitive value of C), 4C, 2C, and C, thus forming a binary weighted set of capacitors. Also, to resolve SAR conversion residue voltage and suppress noise, the DM and DEM operations may be used simultaneously after SAR conversion. The logic circuitry 308 (e.g., logic circuitry) can add the output from the SAR logic to the output from the DM/DEM operations to compensate the noise. The outputs, when added together, are provided at the output 310.

Referring again to the sets 304a, 304b, 304c, and 304d, the set 304a may represent (e.g., be used to generate) the LSBs, while the set 304d may represent the MSBs. Using the DEM operation, the logic circuitry 308 can select capacitors from any one or more of the sets 304a, 304b, 304c, and 304d. For example, in order to generate an output from the sets 304a, 304b, 304c, and 304d at the comparator 306, the logic circuitry 308 may select, using the DEM operation, some capacitors from the set 304a and some capacitors from the set 304b. Accordingly, the DEM operation can shuffle across multiple sets. Further, in some embodiments, one or more of the sets 304a, 304b, and 304c include redundant capacitors. A redundant capacitor may refer to a capacitor that is a copy of another capacitor, and can be used for the same purpose. In this regard, redundant capacitors, when selected during the DEM operation, can compensation segmentation error (e.g., error introduced due to grouping the capacitors into sets).

The apparatus 300 can reuse the capacitors in the sets 304a, 304b, and 304c, as well as the comparator 306, for the DM/DEM operations. Beneficially, additional hardware is generally not required for the DM/DEM operations, and the required changes for the DM/DEM operation may be limited to just the logic circuitry 308. This reduces the overall cost and complexity of enhancing a SAR ADC operation.

Figure 4:
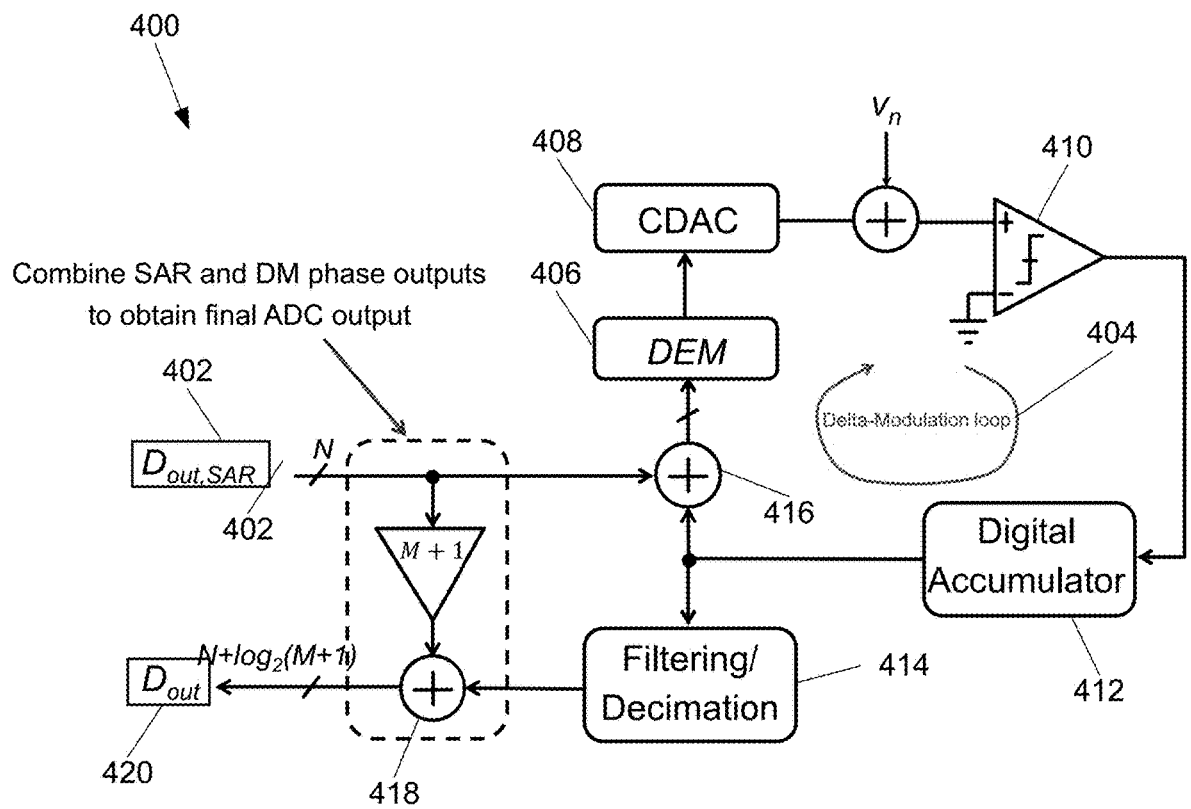
FIG. 4 illustrates a schematic diagram for generating an output of an apparatus, in accordance with aspects of the present disclosure.

FIG. 4 illustrates a schematic diagram for generating an output of an apparatus 400, in accordance with aspects of the present disclosure. The apparatus 400 is designed to generate a $D_{out,SAR}$ 402, representing a digital output (e.g., initial code) from the SAR conversion operation. As shown, the $D_{out,SAR}$ 402 is an N-bit digital output that can stored. The apparatus 400 further includes a DM operation 404 used to perform a predetermined number of cycles. The apparatus 400 further includes DEM operation 406 performed simultaneously with the DM operation 404, using a DAC circuit 408 (e.g., CDAC) and a comparator 410, each of which may be previously used by the apparatus 400 to generate the $D_{out,SAR}$ 402. The apparatus 400 may further include a digital accumulator 412 used to accumulate the outputs from the comparator 410. Also, the apparatus 400 may further include a filtering/decimation circuit 414 used to filter results from the digital accumulator 412. Using an add block 416, the apparatus 400 can sum each sub-conversion result from the SAR conversion and the DM operation 404.

Using an add block 418, the apparatus 400 can add the $D_{out,SAR}$ 402 with the averaged sum obtained by the DM/DEM operations, and generate $D_{out}$ 420, representing the final digital output (e.g., final code) of the apparatus 400. By using the DM/DEM operations and adding the averaged sum to the $D_{out,SAR}$ 402, the resolution of the $D_{out}$ 420 may be increased. The effective number of bits A of the code from the $D_{out}$ 420 may be expressed as:

$$A = N + \log_2(M + 1)$$

where N is the number of bits from $D_{out}$. SAR 402 and M is the number of cycles performed by the DM operation 404. As an example, when N=13 bits and M=63 cycles, A=19 bits. Accordingly, a 13-bit output (N) from the SAR ADC operation results in a 19-bit output (A) using the DM operation 404 and the DEM operation 406. Beneficially, the apparatus 400 provides additional bits, leading to greater resolution.

Figure 5:
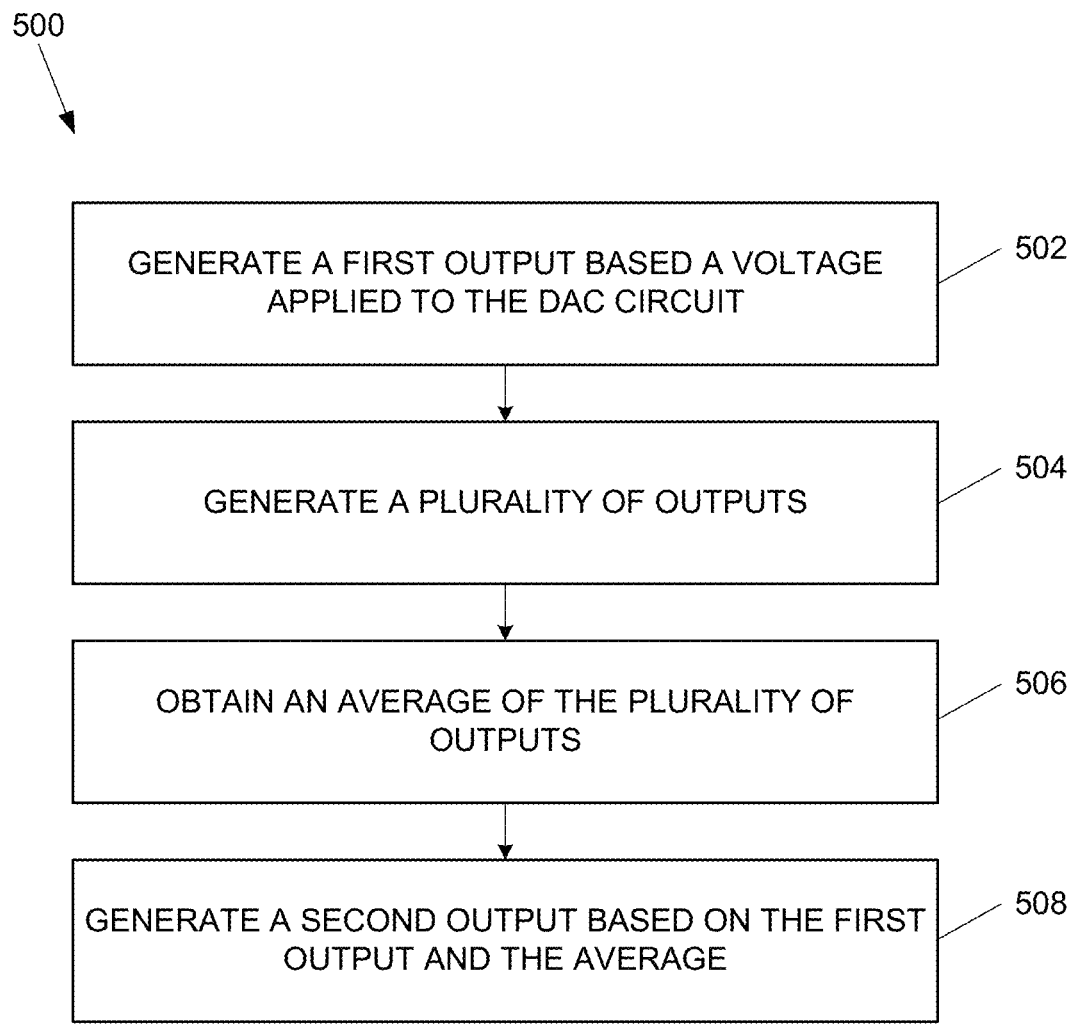
FIG. 5 illustrates a flowchart showing a method for generating an output from an apparatus, in accordance with aspects of the present disclosure.

FIG. 5 illustrates a flowchart 500 showing a method for generating an output from an apparatus, in accordance with aspects of the present disclosure. The apparatus may include an ADC circuit, including a SAR ADC circuit. Accordingly, the ADC circuit may include a DAC circuit, including a CDAC circuit. The outputs may include binary code outputs. The flowchart 500 may be implemented by logic circuitry shown and described herein.

In step 502, a first output based on a voltage applied to the DAC circuit is generated. The first output may be determined using SAR logic. The voltage may take the form of an analog signal. The first output may include a binary output.

In step 504, a plurality of outputs is generated. The plurality of outputs may be determined using DM logic, including IDM logic. The logic circuitry can suppress/filter noise within the apparatus.

In step 506, an average of the plurality of outputs is obtain. While determining each of the outputs, each output may be obtained using a different set of capacitors of the DAC circuit. Put another way, the set of capacitors is updated by defining a new set of capacitors that differs by at least one capacitor, as compared to the prior set of capacitors. The average may suppress/filter the noise of the apparatus.

In step 508, generate a second output based on the first output and the average. For example, the second output may be generated by adding the first output with the average. The second output may be a compensated form of the first output, as the average compensates the first output.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus, comprising:
    a DAC circuit comprising capacitors; and
    circuitry coupled to the DAC circuit, the circuitry configured to:
        generate a first output based on a voltage applied to the DAC circuit,
        generate a plurality of outputs;
        obtain an average of the plurality of outputs, and
        generate a second output based on the first output and the average.

2. The apparatus of claim 1, wherein:
    the capacitors comprise a first set of capacitors and a second set of capacitors separate from the first set of capacitors, and
    the circuitry is further configured to generate the plurality of outputs using the first set of capacitors.

3. The apparatus of claim 2, wherein the circuitry is further configured to generate the plurality of outputs using the second set of capacitors.

4. The apparatus of claim 3, wherein:
    the capacitors further comprise a third set of capacitors separate from the first set of capacitors and separate from the second set of capacitors, and
    the circuitry is further configured to generate the plurality of outputs using the third set of capacitors.

5. The apparatus of claim 1, wherein the second output, in response to being added to the first output, is compensated by the average.

6. The apparatus of claim 1, wherein:
    the first output comprises a first code, and
    the second output comprises a second code.

7. The apparatus of claim 6, wherein:
    the first code comprises a first number of bits, and
    the second code comprises a second number of bits greater than the first number of bits.

8. The apparatus of claim 1, wherein the capacitors comprise:
   a first capacitor having a first capacitance value; and
   a second capacitor having a second capacitance value at least approximately equal to the first capacitance value.

9. The apparatus of claim 1, wherein the circuitry is further configured to generate the plurality of outputs by:
   implementing a delta modulation operation, and
   implementing a dynamic element matching operation simultaneously with the delta modulation operation.

10. An apparatus, comprising:
    a first circuit comprising capacitors;
    a second circuit configured to generate a first code using the first circuit;
    a third circuit configured to generate a number of codes using the first circuit; and
    a fourth circuit configured to select, from the capacitors, a different set of capacitors for each code of the number of codes; and
    a fifth circuit, wherein in response to a determination of an average of the number of codes, the fifth circuit adds the first code with the average to generate a second code.

11. The apparatus of claim 10, wherein the second code comprises a digital code.

12. The apparatus of claim 11, wherein:
    the first code comprises a first number of bits, and
    the second code comprises a second number of bits greater than the first number of bits.

13. The apparatus of claim 10, wherein:
    the first circuit comprises:
       a first set of capacitors, and
       a second set of capacitors separate from the first set of capacitors, and
    the fourth circuit is further configured to update the selected different set of capacitors by selecting different combinations of capacitors from the first set of capacitors.

14. The apparatus of claim 13, wherein the fourth circuit is further configured to update the selected different set of capacitors by selecting different combinations of capacitors from the second set of capacitors.

15. The apparatus of claim 10, wherein while the third circuit generate the number of codes, the fourth circuit selects the different set of capacitors.

16. An apparatus, comprising:
    a capacitive digital to analog converter (CDAC) circuit comprising a plurality of sets of capacitors;
    a first circuit configured to generate a first code based on a SAR operation;
    a second circuit configured to perform, using the CDAC circuit, a first number of cycles and generate a second number of codes, wherein the first number is equal to the second number; and
    a third circuit configured to select one or more capacitors from the plurality of sets of capacitors for each of the first number of cycles.

17. The apparatus of claim 16, wherein an average of the second number of codes is added to the first code to generate a second code.

18. The apparatus of claim 17, wherein:
    the first code comprises a first number of bits, and
    the second code comprises a second number of bits greater than the first number of bits.

19. The apparatus of claim 17, wherein the average is configured to compensate the first code.

20. The apparatus of claim 16, wherein:
    the plurality of sets of capacitors comprise a first set of capacitors, a second set of capacitors, and a third set of capacitors, and
    the third circuit is configured to select the one or more capacitors from at least one of the first set of capacitors, the second set of capacitors, or the third set of capacitors.

* * * * *